(12) United States Patent
Draxelmayr

(10) Patent No.: US 7,868,669 B2
(45) Date of Patent: Jan. 11, 2011

(54) SELF-REGULATED CHARGE PUMP WITH LOOP FILTER

(75) Inventor: Dieter Draxelmayr, Villach (AT)

(73) Assignee: Infineon Technologies AG, Neubiberg (DE)

( * ) Notice: Subject to any disclaimer, the term of this patent is extended or adjusted under 35 U.S.C. 154(b) by 32 days.

(21) Appl. No.: 12/055,371

(22) Filed: Mar. 26, 2008

(65) Prior Publication Data
US 2009/0243670 A1    Oct. 1, 2009

(51) Int. Cl.
*H03L 7/06* (2006.01)
(52) U.S. Cl. .................................. 327/148; 327/157
(58) Field of Classification Search .................. None
See application file for complete search history.

(56) References Cited

U.S. PATENT DOCUMENTS 6,118,346 A * 9/2000 Olgaard ...................... 331/17
6,727,735 B2 * 4/2004 Park ............................ 327/157
6,756,838 B1 * 6/2004 Wu et al. ..................... 327/536
6,897,709 B2 * 5/2005 Henry ......................... 327/536
6,897,733 B2   5/2005 Wakayama
7,075,348 B2 * 7/2006 Hsu et al. .................... 327/157
7,081,781 B2 * 7/2006 Zhu et al. .................... 327/157
7,184,510 B2 * 2/2007 Jung ........................... 375/374
2005/0083090 A1   4/2005 Moraveji
2005/0127984 A1 * 6/2005 Ohtaka ....................... 327/536
2005/0189973 A1 * 9/2005 Li ............................... 327/157

FOREIGN PATENT DOCUMENTS

DE          3728022 C2      8/1989

* cited by examiner

*Primary Examiner*—Cassandra Cox
(74) *Attorney, Agent, or Firm*—SpryIP, LLC

(57) ABSTRACT

One embodiment described is a charge pump arrangement that includes at least one input node and two output nodes. A regulator is included to regulate at least one of the two output nodes, the regulator is decoupled from one of the two output nodes, and the regulator has at least one input coupled directly to virtual ground.

19 Claims, 4 Drawing Sheets

SELF-REGULATED CHARGE PUMP WITH LOOP FILTER

BACKGROUND

Phase-lock-loops (PLL) may utilize a phase detector for comparing the phase of a reference clock with that of an output clock that utilizes a voltage controlled oscillator (VCO) to generate a phase error that varies a control voltage on the input to the VCO. By adjusting this control voltage, the phase of the VCO can be locked to the phase of the reference clock. Typically, some type of loop filter is disposed between the phase detector and the VCO. Generally, the loop filter is used to perform the function of blocking off undesirable frequency from the incoming signals.

In a PLL system, a typical phase detector generates control voltages for controlling a charge pump circuit which is operable to selectively pump charge (UP current) to a node for increasing a voltage level or pulling charge (DOWN current) from the node to provide a decreasing voltage level. To increase the voltage level, charge is sourced from a supply and, to decrease the voltage level, charge is sinked to a ground reference. When the relative phase between the VCO and the reference clock are either lagging or leading, then either the sourcing or sinking of a charge pump is controlled.

Charge pumps may include two current sources that are switched to the voltage input of the VCO. When charge is being sourced to the node, the phase of the VCO will change from either a lagging or leading phase to a leading or lagging phase, such that the phase detector will then cause the charge pump to sink current. When the PLL is locked, the phase error should be substantially at a zero phase error, which should result in no current being sourced to or sinked from the voltage control input of the VCO.

A prior art charge pump 100 is illustrated in FIG. 1. The charge pump 100 includes an loop filter 102 that is constructed as an RC network. Specifically, the loop filter 102 includes a resistor 104 and a capacitor 106 in series, where the capacitor 106 has a terminal coupled to a reference potential. The resistor 104 and the capacitor 106 define the zero of the loop filter 102. The loop filter 102 further includes a capacitor 108 coupled in parallel with the resistor 104 and the capacitor 106. The loop filter 102 is coupled to a first output node 110 of the charge pump 100. The loop filter 102 is primarily implemented to suppress spikes, ringing and other noise that may influence a regulator 112 (discussed in the next paragraph) when the charge pump 100 handles input control voltages.

As stated, the prior art charge pump 100 also includes the regulator 112, which is used to regulate a second output node 114 of the charge pump 100 to the same voltage at a node 116 of the loop filter 102. This is achieved by controlling a current source 120. A capacitor 118 is coupled to the second output node 114 and the regulator 112. Assuming appropriate component value selection, the capacitor 118 coupled with the capacitor 106 ensure the first output node 110 and the second output node 114 are in static balance with respect to one another.

The prior art design shown in FIG. 1 may introduce unwanted noise to the regulator 112. Typically, such noise is introduced from oscillations on the first output node 110. Any noise input to the regulator 112 may negatively affect its performance.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

Exemplary implementations of a charge pump are described herein. One such charge pump employs a regulator that is decoupled from an output of the charge pump. This decoupling of the regulator prevents noise on the output of the charge pump from affecting the performance of the regulator.

Exemplary Arrangements

Figure 1:
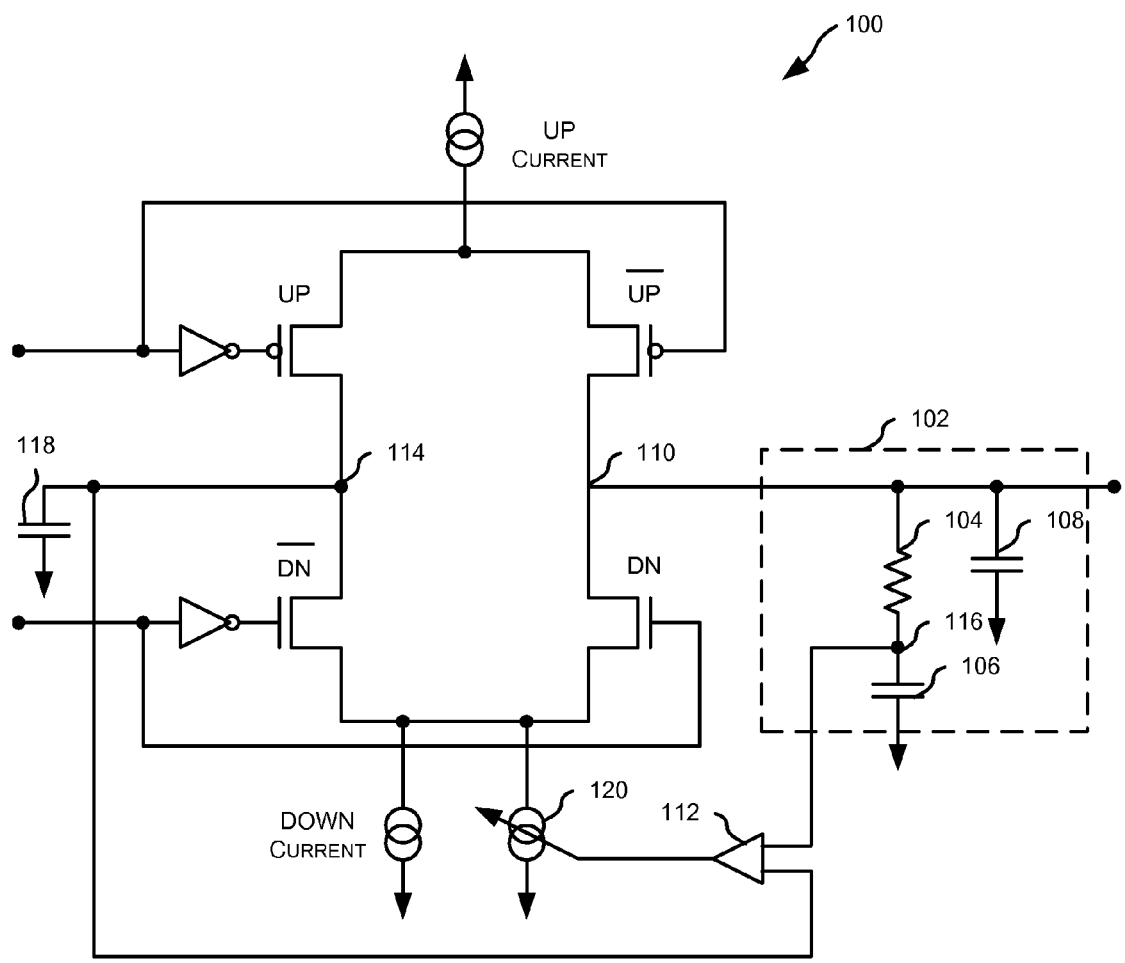
FIG. 1 illustrates a prior art charge pump circuit that may be employed in a phase-lock-loop (PLL) system that incorporates a phase detector that supplies control signals to a charge pump.
Figure 2:
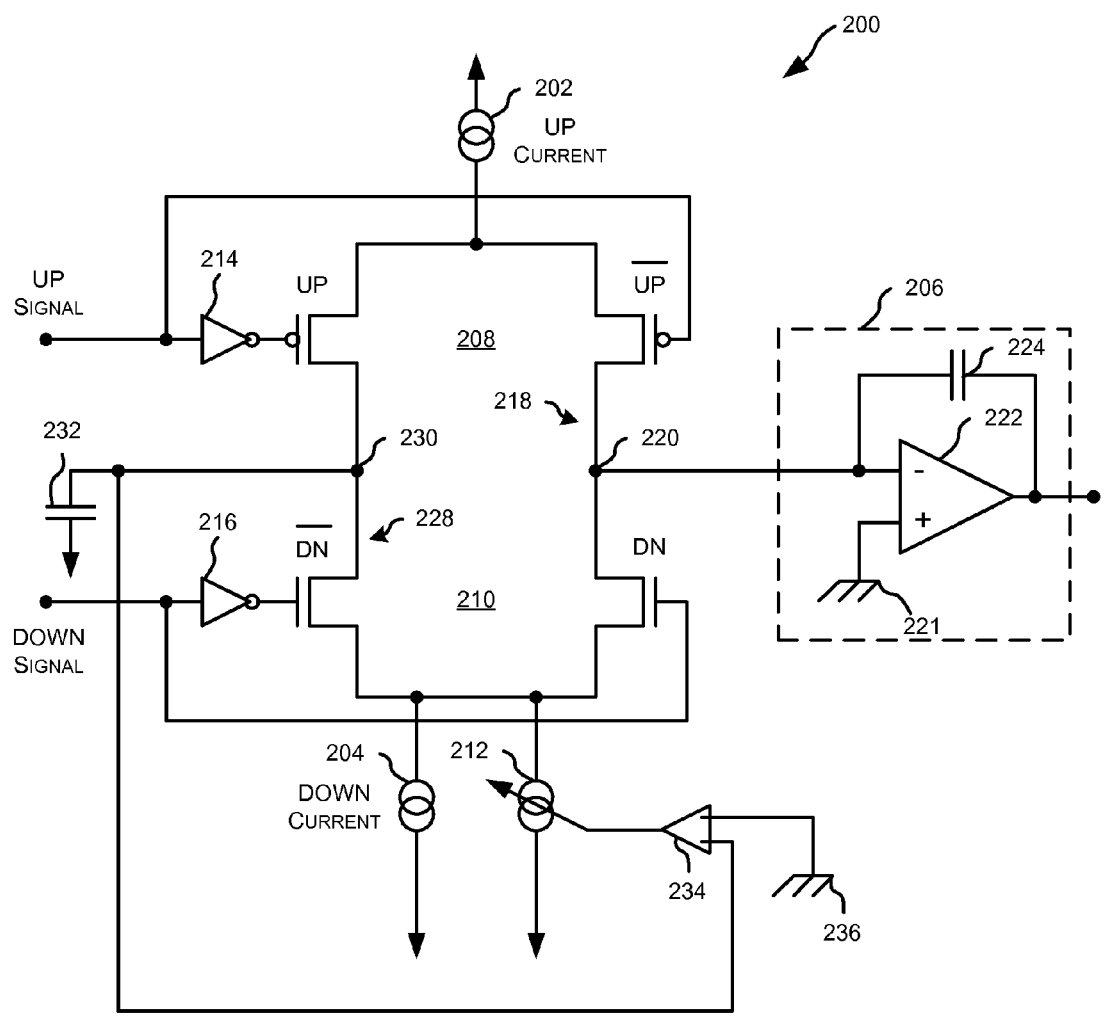
FIG. 2 illustrates a charge pump circuit according to a present implementation and that may be employed in a phase-lock-loop (PLL) system that incorporates a phase detector that supplies control signals to the charge pump circuit.

FIG. 2 illustrates a charge pump circuit 200 according to a present implementation and that may be employed in a PLL system that incorporates a phase detector that supplies control signals to the charge pump circuit 200. The charge pump circuit 200 has two control signal inputs that receive UP and DOWN signals from a control device (not illustrated). The control device may be a phase detector, a frequency mixer, analog multiplexer, or other similar device. Two switched current sources 202 and 204 are part of the charge pump circuit 200. The current sources 202 and 204, when active, supply positive and negative current (e.g., UP current and DOWN current), respectively, to a loop filter 206. The loop filter 206 may be an active filter or a passive filter.

The charge pump 200 also includes two switching sections 208 and 210. The switching section 208 includes two P-channel transistors, where the source terminals thereof are coupled to the current source 202. The drains of the P-channel transistors are coupled to the drains of two N-channel transistors, which are part of the switching section 210. The sources of the N-channel transistors are connected to the current source 204. In addition, the sources of the N-channel transistors are also connected to a regulated current source 212. As those of skill in the art appreciate, the use of N- and P-channel transistors in the configuration shown in FIG. 2 is merely a matter of design choice. Other configurations may be used while still gaining the benefits of the implementations described herein.

The gate terminals of the P-channel transistors are coupled to the input that receives the UP signal, where the gate terminals of the N-channel transistors are coupled to the input that receives the DOWN signal. One of the P-channel transistors of the switching section 208 has an inverter 214 interposed between the gate of the P-channel transistor and the input that receives the UP signal. Similarly, one of the N-channel transistors of the switching section 210 has an inverter 216 interposed between the gate of the N-channel transistor and the input that receives the DOWN signal. The use of the inverters 214 and 216 in the manner illustrated in FIG. 2 is a matter of design choice, and other implementations that may or may not make use of such inverters are also possible. For example, complementary signals may also be created using differential/symmetrical latch circuitry. In general, any arrangement that supplies complementary/switching signals may be used in connection with the charge pump 200.

One current path 218, defined by a drain of one of the P-channel transistors and a drain of one of the N-channel transistors, has a first output node 220. The first output node 220 supplies source (UP) and sink (DOWN) current to the loop filter 206.

The loop filter 206 includes an operational amplifier 222 and a capacitor 224. The first output node 220 feeds into the inverting input of the operational amplifier 222. The non-inverting input of the operational amplifier 222 is connected to a ground reference 221 (e.g., virtual ground). Virtual ground may be a node of a circuit that is maintained at a steady reference potential, without being connected directly to the reference potential. In some cases the reference potential is considered to be the surface of the earth, and the reference node is called "ground" or "earth" as a consequence. In another characterization, the non-inverting input of the operational amplifier 222 is grounded (e.g. the ground reference 221); then the inverting input of the amplifier 222, although not connected to ground, will assume a similar potential, becoming a virtual ground.

The output of the operational amplifier 222 feeds back to the inverting input through the capacitor 224. The illustrated loop filter 206 may be implemented using various designs and components. For example, the loop filter 206 may include additional resistor-capacitor (RC) circuitry. As those of ordinary skill in the art appreciate, other filter arrangements may also be used.

Use of the loop filter 206 makes it possible to amplify the input signal. The amplification is made possible by the operational amplifier 222 employed in the loop filter 206. As a result, the charge pump 202 only generates signals whose dynamic range is a fraction of the full dynamic range required by a VCO connected to the output of the loop filter 206. This reduces the complexity of the charge pump 200 and minimizes the current mismatch of the charge pump 200.

Another current path 228, defined by a drain of another of the P-channel transistors and a drain of another of the N-channel transistors, has a second output node 230. The second output node 230 is coupled to a capacitor 232.

The charge pump 200 employs the use of a regulator device 234. The regulator device 234 has a first input coupled to a ground reference 236 (e.g., virtual ground). Therefore, the regulator device 234 is decoupled from the first output node 220. Generally, virtual ground may be a node of a circuit that is maintained at a steady reference potential, without being connected directly to the reference potential. In some cases the reference potential is considered to be the surface of the earth, and the reference node is called "ground" or "earth" as a consequence. The regulator device 234 has a second input coupled to the second output node 230 and a terminal of the capacitor 232. An output of the regulator device 234 is coupled to the regulated current source 212.

In some implementations, the ground reference 236 may be the same as the ground reference 221 (i.e., the references 221 and 236 may share a common node). Moreover, in some implementations, the same voltage level may be present at the references 236 and 221.

Description of the operational characteristics of the charge pump 200 is now provided. During steady state, that is when neither an UP signal nor a DOWN signal is being input to the charge pump 200, any current associated with the second current path 228 is dumped into the capacitor 232 via the second output node 230. During this state, when neither an UP signal nor a DOWN signal is being input, the regulator 234 attempts to regulate the voltage level at the second output node 230 against virtual ground. In addition, the loop filter 206 also regulates against virtual ground. In the present implementation, the regulator 234 does not reference the first output node 220 as part of the regulation process. Instead, the regulator 234 simulates the first output node 220 using the ground reference 236. The regulator 234 seeks to achieve this voltage regulation using the regulated current source 212.

The design illustrated in FIG. 2 has many advantages over prior art designs. For example, regulation against virtual ground may eliminate the negative effects related to kickback noise that may be created by devices downstream of the charge pump 200. Moreover, decoupling the loop filter 206 from the regulator 234 prevents the loop filter 206 from interfering with the regulator 234 during current regulation.

Further to the above, in response to an $\overline{UP}$ signal, an UP current is sourced from the first output node 220 to the loop filter 206. In response to a DOWN signal, a DOWN current is sinked from the first output node 220. As those of ordinary skill in the art appreciate, the charge pump 200 receives an UP or DOWN signal and produces an output in order to maintain an associated PLL in a "locked" state.

The charge pump 200 may be modified to include a switching mechanism that is designed to interrupt the regulator 234 while the charge pump 200 is receiving UP or DOWN signals. In one example, two switches are placed in series arrangement after the output of the regulator 234. One of the two switches is connected to the input node that receives the UP signal (e.g., an $\overline{UP}$ signal) and another of the two switches is connected to the input node that receives the DOWN signal. The two switches remain closed unless an UP or DOWN signal is present. In another alternative, a switching mechanism may be arranged to interrupt one or more inputs of the regulator 234. Again, the interrupting would occur if an UP or DOWN signal is received by the charge pump 200. Switching mechanisms other than the two switch example suggested may also be used to interrupt the regulator 234.

Figure 3:
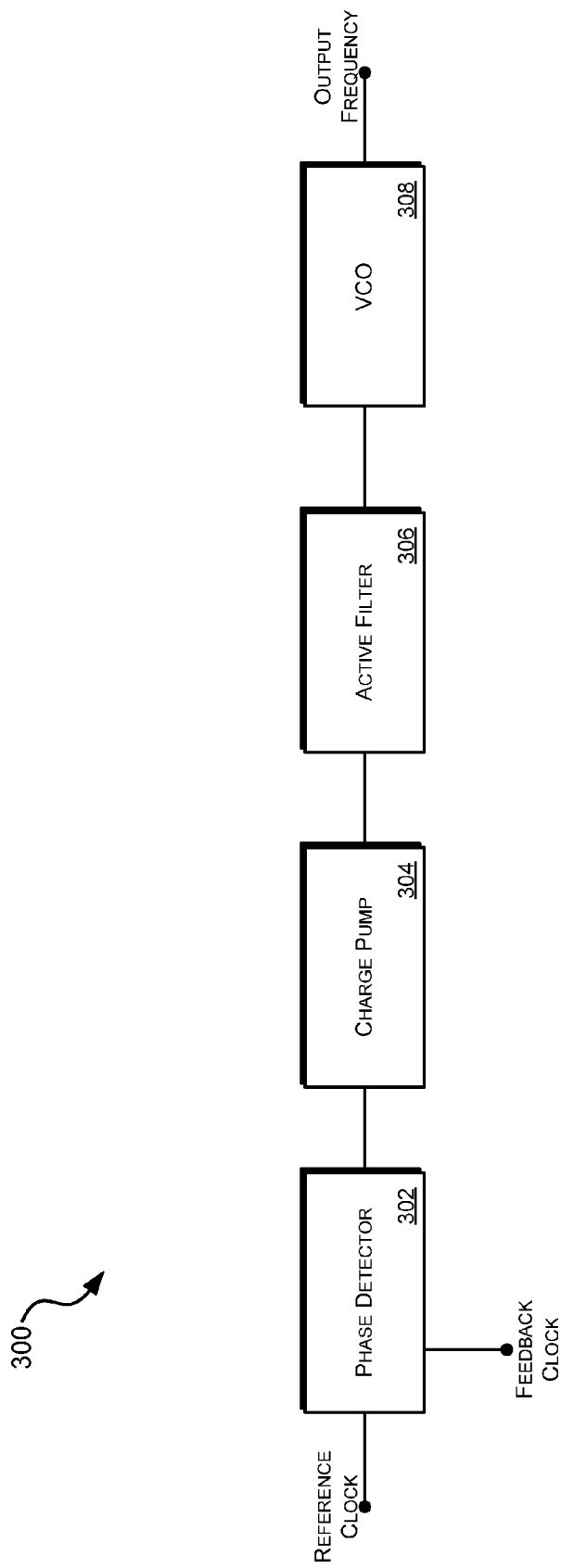
FIG. 3 illustrates a phase-lock-loop (PLL) implementation that may employ the charge pump shown in FIG. 2.

FIG. 3 illustrates a phase-lock-loop (PLL) 300 implementation that may employ the charge pump 200 shown in FIG. 2. A reference clock may be supplied to a phase detector 302. The phase detector 302 also receives a feedback clock from voltage controlled oscillator (VCO) 308. The phase detector 302 detects a difference between the reference clock and the feedback clock, and a charge pump 304, coupled to a loop filter 306, generates a charge corresponding to the difference to drive the VCO 408. Therefore, the VCO 308 output is adjusted up and down to remain "locked" to the reference clock.

Exemplary Environment

Figure 4:
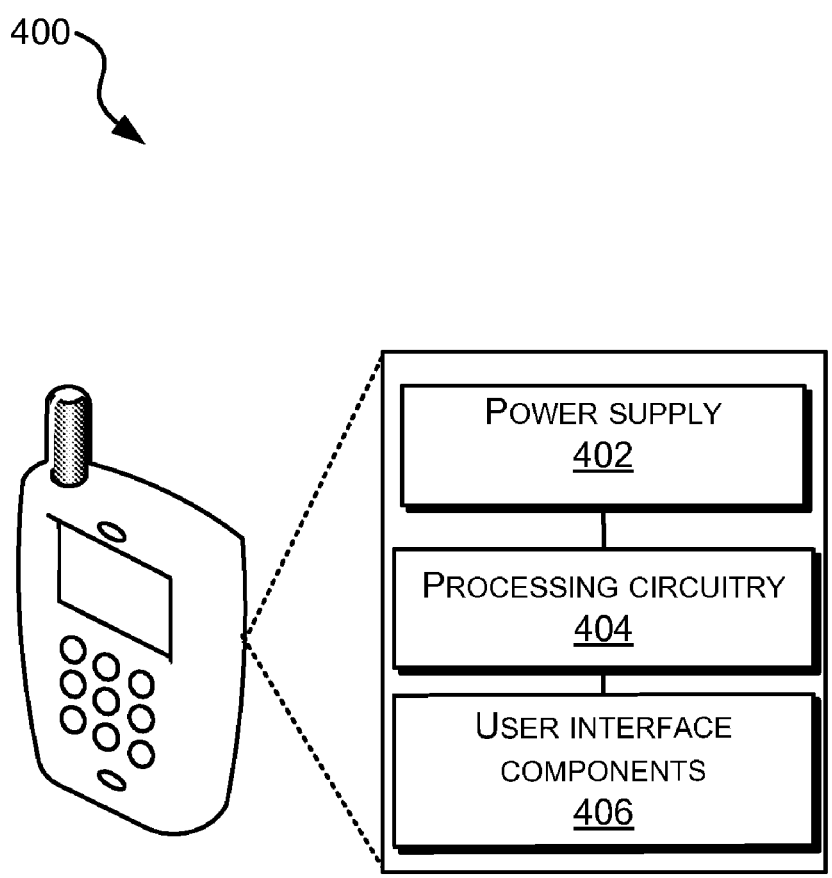
FIG. 4 shows an exemplary environment in which a charge pump may be utilized.

FIG. 4 shows a simplified exemplary implementation of a device 400 that may incorporate a PLL and an associated charge pump. The device 400 may be a portable device, such as a cell phone, having components including a power supply 402, processing circuitry 404 and user interface components 406. The processing circuitry 404 may include an integrated circuit chip and/or other components used to enable operation of the device 400. The user interface components 406 may include a display, keypad, and so forth. Any of the described elements 402, 404 and 406 may implement a PLL and charge pump of the types described herein. Additionally, other components of the device 400, which are not described herein for reasons related to at least brevity, may also implement such PLLs and charge pumps. For the purposes of at least simplicity, further details of the power supply 402, the processing circuitry 404 and the user interface components 406 are not shown or described.

Conclusion

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

What is claimed is:

1. A charge pump arrangement, comprising:
    at least one input node;
    two output nodes;
    a regulator to regulate at least one of the two output nodes, the regulator decoupled from one of the two output nodes, the regulator having at least one input coupled directly to virtual ground; and
    a switching mechanism coupled to the regulator.

2. The charge pump arrangement according to claim 1, wherein the regulator has another input coupled to one of the two output nodes.

3. The charge pump arrangement according to claim 1, wherein the switching mechanism interrupts the regulator when a signal is received by the at least one input node.

4. The charge pump arrangement according to claim 1, wherein the at least one input node includes a first input node and a second input node.

5. The charge pump arrangement according to claim 1, further comprising a filter device coupled to one of the two output nodes.

6. The charge pump arrangement according to claim 5, wherein the filter device is a loop filter.

7. The charge pump arrangement according to claim 5, wherein the filter device includes an operational amplifier having an input coupled to virtual ground.

8. An apparatus, comprising:
    a phase-lock-loop (PLL); and
    a charge pump coupled to the PLL, the charge pump comprising:
    at least one input node;
    two output nodes; and
    a regulator to regulate at least one of the two output nodes, the regulator decoupled from one of the two output nodes, the regulator having at least one input coupled directly to virtual ground.

9. The charge pump arrangement according to claim 8, wherein the regulator has another input coupled to one of the two output nodes.

10. The charge pump arrangement according to claim 8, further comprising a switching mechanism coupled to the regulator.

11. The charge pump arrangement according to claim 10, wherein the switching mechanism interrupts the regulator when a signal is received by the at least one input node.

12. The charge pump arrangement according to claim 8, wherein the at least one input node includes a first input node and a second input node.

13. The charge pump arrangement according to claim 8, further comprising a filter device coupled to one of the two output nodes.

14. The charge pump arrangement according to claim 13, wherein the filter device is a loop filter.

15. The charge pump arrangement according to claim 13, wherein the filter device includes an operational amplifier having an input coupled to virtual ground.

16. A charge pump device, comprising:
    a first current source and a second current source;
    a first output node and a second output node;
    a first current path, the first current path having a first device coupled to the first current source and further coupled to the first output node, the first current path further having a second device coupled to the second current source and further coupled to the first output node;
    a second current path, the second current path having a third device coupled to the first current source and further coupled to the second output node, the second current path further having a fourth device coupled to the second current source and further coupled to the second output node;
    a filter coupled to the second output node; and
    a regulator coupled to the first output node and further coupled to virtual ground.

17. The charge pump device according to claim 16, wherein the first, second, third and fourth devices are transistors.

18. The charge pump arrangement according to claim 16, further comprising a switching mechanism coupled to the regulator.

19. The charge pump arrangement according to claim 18, wherein the switching mechanism interrupts the regulator when a signal is received by the at least one input node.

* * * * *